US012572169B2

(12) United States Patent
Huang et al.

(10) Patent No.: US 12,572,169 B2
(45) Date of Patent: Mar. 10, 2026

(54) FOLDABLE ELECTRONIC DEVICE

(71) Applicant: ASUSTeK COMPUTER INC., Taipei City (TW)

(72) Inventors: Te-Wei Huang, Taipei City (TW); Sih-Ci Li, Taipei City (TW)

(73) Assignee: ASUSTeK COMPUTER INC., Taipei City (TW)

( * ) Notice: Subject to any disclaimer, the term of this patent is extended or adjusted under 35 U.S.C. 154(b) by 200 days.

(21) Appl. No.: 17/986,909

(22) Filed: Nov. 15, 2022

(65) Prior Publication Data

US 2024/0103570 A1      Mar. 28, 2024

(30) Foreign Application Priority Data

Sep. 27, 2022    (TW) .................................. 111136485

(51) Int. Cl.
*G06F 1/16*          (2006.01)
*G06F 1/20*          (2006.01)
*H05K 5/02*          (2006.01)

(52) U.S. Cl.
CPC .......... *G06F 1/1618* (2013.01); *G06F 1/1681* (2013.01); *G06F 1/203* (2013.01); *H05K 5/0226* (2013.01)

(58) Field of Classification Search
None
See application file for complete search history.

(56) References Cited

U.S. PATENT DOCUMENTS

| | | | | |
|---|---|---|---|---|
| 9,740,253 | B2 * | 8/2017 | Cheng .................... | G06F 1/1681 |
| 10,534,408 | B2 * | 1/2020 | Cheng .................... | G06F 1/1616 |
| 11,797,058 | B2 * | 10/2023 | Lin .......................... | G06F 1/203 |
| 11,874,713 | B2 * | 1/2024 | Chen .................. | H05K 7/20172 |
| 2002/0012228 | A1 * | 1/2002 | Ozaki ...................... | G06F 1/203 |
| | | | | 361/679.48 |
| 2004/0012919 | A1 * | 1/2004 | Chen ..................... | G06F 1/1667 |
| | | | | 361/679.11 |
| 2022/0269316 | A1 * | 8/2022 | Onda ...................... | G06F 1/166 |

FOREIGN PATENT DOCUMENTS

| | | |
|---|---|---|
| CN | 101231537 | 3/2011 |
| CN | 102413652 | 1/2015 |

* cited by examiner

*Primary Examiner* — Anthony Q Edwards
*Assistant Examiner* — Rashen E Morrison
(74) *Attorney, Agent, or Firm* — JCIPRNET

(57) ABSTRACT

A foldable electronic device includes a first body, a second body, a pivot, and a sensing component. The pivot is pivotally connected between the first body and the second body. The first body and the second body are configured to rotate relative to each other through the pivot, and the pivot includes a driving element. The sensing component is coupled to the pivot and the second body, and includes a sensing substrate and an interfering element connecting the sensing substrate. The driving element structurally interferes with the interfering element while rotating along with the pivot, so as to drive the interfering element to rotate, such that the sensing substrate rotates between an initial position where the sensing substrate leans on a back surface of the second body, and an operating position where an acute angle is formed between the sensing substrate and the back surface of the second body.

10 Claims, 10 Drawing Sheets

FOLDABLE ELECTRONIC DEVICE

CROSS-REFERENCE TO RELATED APPLICATION

This application claims the priority benefit of Taiwan application serial no. 111136485, filed on Sep. 27, 2022. The entirety of the above-mentioned patent application is hereby incorporated by reference herein and made a part of this specification.

BACKGROUND

Technical Field

The disclosure relates to an electronic device, and more particularly relates to a foldable electronic device.

Description of Related Art

Foldable mobile electronic devices have been introduced to the market and have become more mature in recent years. A foldable mobile electronic device (such as a smart phone, a tablet computer, and a laptop computer) may include a first body and a second body pivotally connected to each other. For example, the first body and the second body can be a main body and a screen body respectively, which are pivotally connected through a pivot, so as to be transformed between two states, folded up or unfolded for operation.

However, such foldable devices have not yet appeared in the gaming mobile device market. With the increasing demand for gaming devices with high dynamic and high sound and light effects, how to design the optimal mechanism configuration and the optimal finger operation area within the limited space of a foldable mobile electronic device has become an urgent issue in the industry.

SUMMARY

The disclosure provides a foldable electronic device, in which a sensing component is disposed at a pivot, so as to expand a function key in the limited space and be more convenient for the user to operate.

The foldable electronic device according to an embodiment of the disclosure includes a first body, a second body, a pivot, and a sensing component. The pivot is pivotally connected between the first body and the second body. The first body and the second body are configured to rotate relative to each other through the pivot, and the pivot includes a driving element. The sensing component is coupled to the pivot and the second body and includes a sensing substrate and an interfering element connecting the sensing substrate. The driving element structurally interferes with the interfering element while rotating along with the pivot, so as to drive the interfering element to rotate, such that the sensing substrate rotates between an initial position where the sensing substrate leans on a back surface of the second body, and an operating position where an acute angle is formed between the sensing substrate and the back surface of the second body.

In an embodiment of the disclosure, the second body further includes a sliding rail, and the interfering element further includes a slider slidably disposed in the sliding rail. When the driving element drives the interfering element to rotate, the slider slides along the sliding rail to cause the sensing component to rotate relative to the second body.

In an embodiment of the disclosure, the interfering element is rotatably inserted into the second body.

In an embodiment of the disclosure, the driving element includes a protrusion, and the protrusion is configured to push the interfering element to drive the interfering element to rotate when the pivot rotates.

In an embodiment of the disclosure, the foldable electronic device further includes an elastic restoring element connected between the second body and the interfering element to use an elastic restoring force of the elastic restoring element to restore the sensing substrate at the operating position to the initial position.

In an embodiment of the disclosure, the driving element includes a gear, and the interfering element includes a rack engaged with the gear. The gear drives the rack to rotate when the pivot rotates.

In an embodiment of the disclosure, the sensing substrate includes a sensor electrically connected to the second body.

In an embodiment of the disclosure, the sensor includes an ultrasonic sensor or a pressure sensor.

In an embodiment of the disclosure, the second body further includes a plurality of heat dissipation ports disposed on the back surface of the second body.

In an embodiment of the disclosure, the sensing substrate covers the plurality of heat dissipation ports when the sensing substrate is at the initial position, and the sensing substrate exposes the plurality of heat dissipation ports when the sensing substrate is at the operating position.

Based on the above, in the foldable electronic device according to the disclosure, the sensing component is disposed at the pivot on the back surface of the body, and the driving element of the pivot and the interfering element of the sensing component form structural interference, so as to drive the interfering element to rotate, such that the sensing substrate of the sensing component rotates along with the pivot between the initial position where the sensing substrate leans on the back surface of the second body and the operating position where the sensing substrate forms an acute angle with the back surface of the second body. With such a configuration, the user may rotate and unfold the foldable electronic device from the folded state to the unfolded state, such that the sensing component is driven by the pivot to automatically rotate to the operating position for the user to operate. Thus, when the user holds the foldable electronic device, the user may easily touch the sensing component located on the back surface of the body with the user's finger to control the foldable electronic device to perform a corresponding command (for example, confirmation, volume adjustment, display brightness adjustment, or any specific function). Therefore, the foldable electronic device according to the disclosure may be expanded with a sensing component with a corresponding function within the limited space, and the position thereof is more convenient for the user to operate, which improves the design flexibility, operation convenience, and user friendliness of the foldable electronic device.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
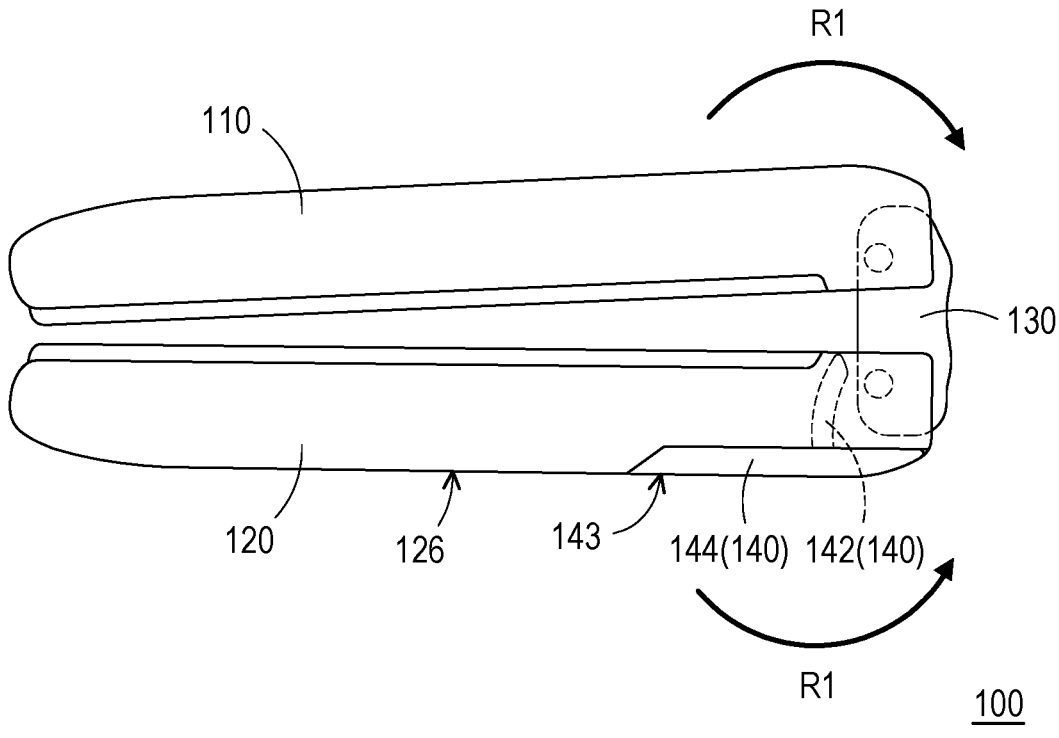
FIG. 1 is a schematic diagram of a foldable electronic device in a folded state according to an embodiment of the disclosure.

The foregoing and other technical contents, features, and effects of the disclosure will be clearly presented in the following detailed description of each embodiment with reference to the drawings. The directional terms mentioned in the following embodiments, such as "up," "down," "front," "rear," "left," and "right," only indicate directions with reference to the attached drawings. Therefore, the directional terms used herein are illustrative, and are not intended to limit the disclosure. Also, in the following embodiments, the same or similar elements will be given the same or similar reference numerals.

Figure 2:
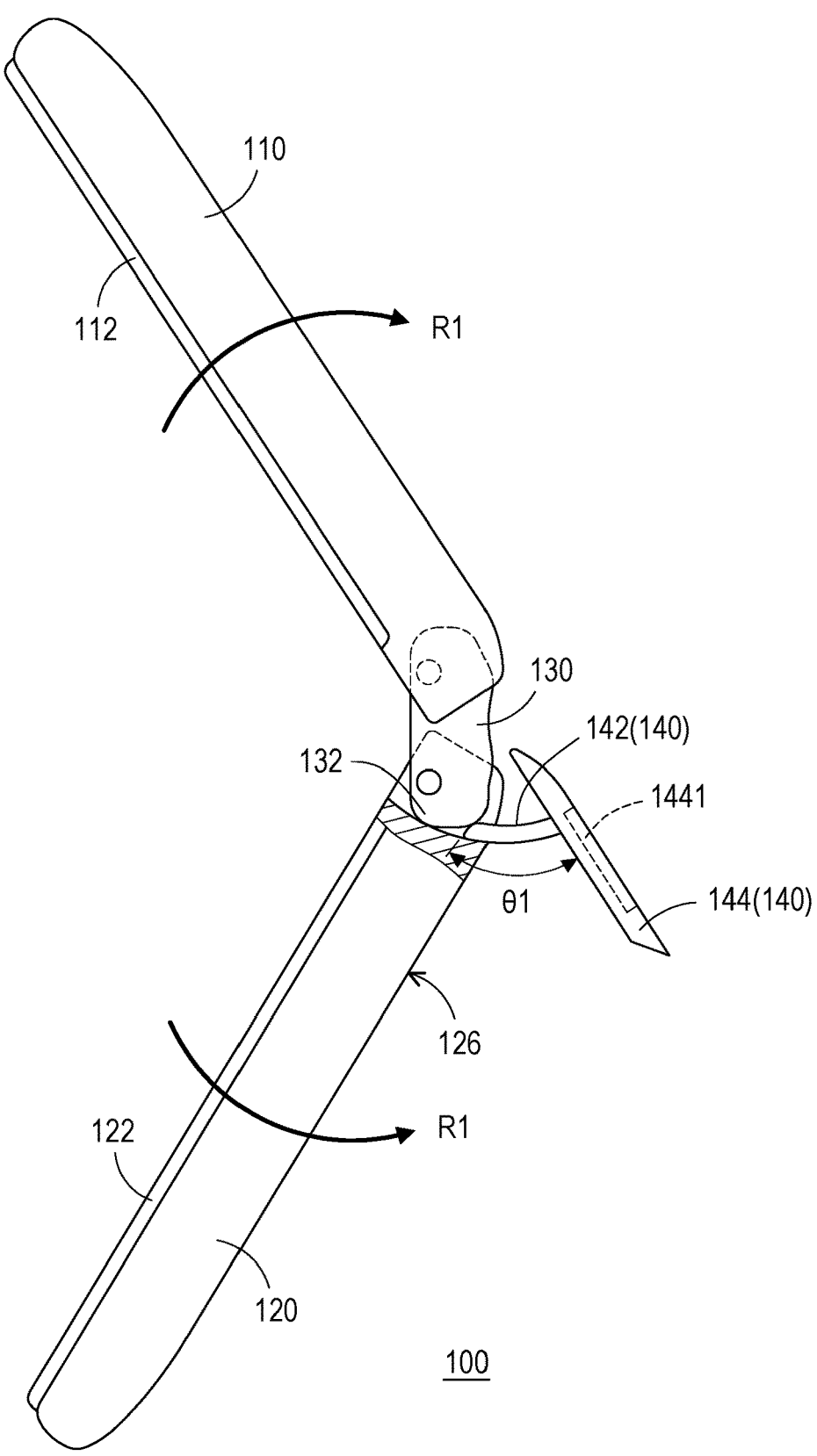
FIG. 2 is a schematic diagram of the foldable electronic device of FIG. 1 in an unfolded state.
Figure 3:
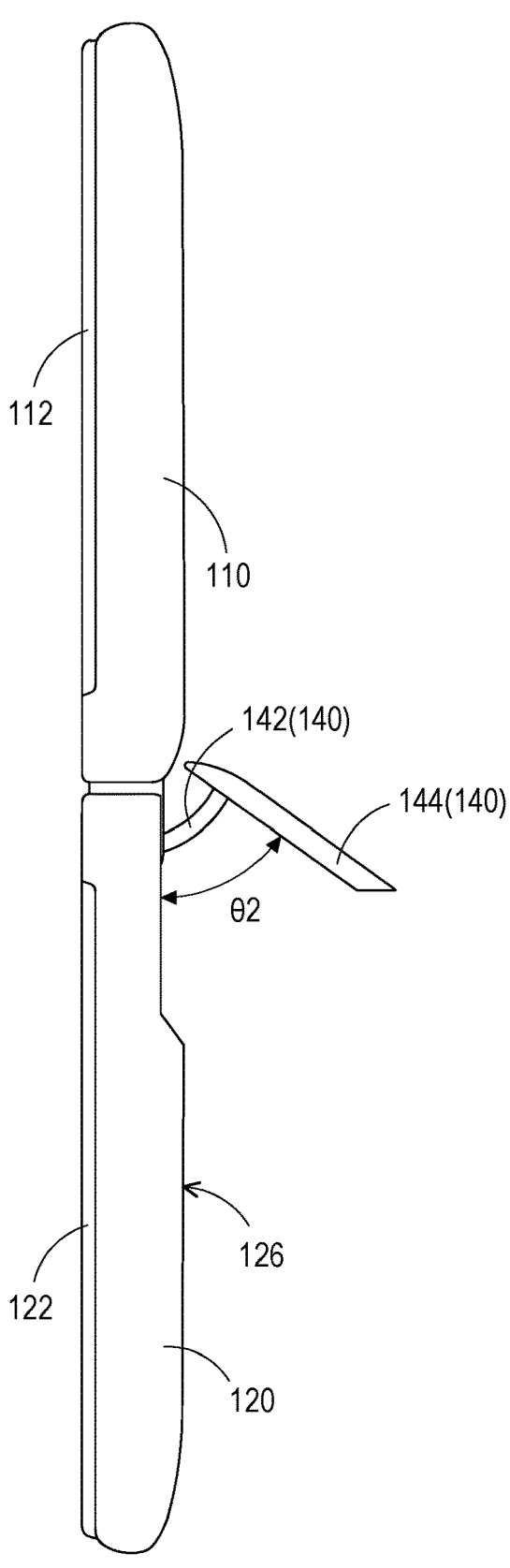
FIG. 3 is a schematic diagram of the foldable electronic device of FIG. 1 in a fully unfolded state.

FIG. 1 is a schematic diagram of a foldable electronic device in a folded state according to an embodiment of the disclosure. FIG. 2 is a schematic diagram of the foldable electronic device of FIG. 1 in an unfolded state. FIG. 3 is a schematic diagram of the foldable electronic device of FIG. 1 in a fully unfolded state. Referring to FIG. 1 to FIG. 3, a foldable electronic device 100 includes a first body 110, a second body 120, a pivot 130, and a sensing component 140. In this embodiment, the first body 110 may be, for example, a display body, which may include a display 112. The second body 120 may be, for example, a main body, which may include an input interface, such as a keyboard and a touch screen, disposed on the second body 120. Nevertheless, the disclosure is not limited thereto. In other embodiments, the first body 110 and the second body 120 of the foldable electronic device 100 may both be designed with displays. That is, the first body 110 may include a first touch display, and the second body 120 may include a second touch display. The disclosure is not intended to limit the component configurations and functions of the first body 110 and the second body 120.

In some embodiments, the pivot 130 is pivotally connected between the first body 110 and the second body 120, which allows the first body 110 and the second body 120 to rotate relative to each other along the rotation direction R1 through the pivot 130 from the folded state as shown in FIG. 1 to the unfolded state as shown in FIG. 2 and then to the fully unfolded state as shown in FIG. 3, for example. When the foldable electronic device 100 is in the unfolded state as shown in FIG. 2, an angle may be formed between the first body 110 and the second body 120, and the angle may be less than approximately 180 degrees. When the foldable electronic device 100 is in the fully unfolded state as shown in FIG. 3, the corresponding surfaces of the first body 110 and the second body 120 may be substantially coplanar (for example, the angle is approximately equal to 180 degrees).

Referring to FIG. 1 to FIG. 3, in some embodiments, the sensing component 140 is coupled between the pivot 130 and the second body 120. The pivot 130 may include a driving element 132, and the sensing component 140 may include an interfering element 142 corresponding to the driving element 132 and a sensing substrate 144. In an embodiment, the interfering element 142 connects the sensing substrate 144 and is adapted to drive the sensing substrate 144 to rotate. In an embodiment, the interfering element 142 is rotatably inserted into the second body 120 and is adapted to abut against the driving element 132. In this way, the driving element 132 forms structural interference with the interfering element 142 while rotating along with the pivot 130, so as to drive the interfering element 142 to rotate, such that the sensing substrate 144 is driven by the interfering element 142 to rotate between the initial position as shown in FIG. 1 and the operating position as shown in FIG. 2 or FIG. 3. In some embodiments, the sensing substrate 144 includes a sensor 1441 that is electrically connected to a controller in the first body 110 and/or the second body 120. In this embodiment, the sensor 1441 may include an ultrasonic sensor or a pressure sensor.

Thus, when the user touches the sensing substrate 144 on the back surface of the body with the user's finger, the sensor 1441 may generate a corresponding sensing signal according to the user's touch, and the controller in the first body 110 and/or the second body 120 may receive the sensing signal and control the foldable electronic device 100 to perform a corresponding command accordingly (for example, confirmation, volume adjustment, display brightness adjustment, or any specific function).

Specifically, when the foldable electronic device 100 is in the folded state as shown in FIG. 1, the sensing substrate 144 is at the initial position. At this time, the sensing substrate 144 leans on the back surface 126 of the second body 120. In this embodiment, when the sensing substrate 144 is at the initial position, the outer surface 143 of the sensing substrate 144 and the back surface 126 of the adjacent second body 120 are substantially coplanar. When the foldable electronic device 100 rotates to the unfolded state as shown in FIG. 2, the sensing substrate 144 is at the (first) operating position. At this time, the sensing substrate 144 and the back surface 126 of the second body 120 form an acute angle θ1. When the foldable electronic device 100 continues to rotate to the fully unfolded state as shown in FIG. 3, the sensing substrate 144 is at the (second) operating position. At this time, the sensing substrate 144 and the back surface 126 of the second body 120 form an acute angle θ2, wherein the acute angle θ2 may be greater than the acute angle θ1.

With such a configuration, the user may rotate and unfold the foldable electronic device 100 to the unfolded state, such that the sensing substrate 144 of the sensing component 140 is driven by the pivot 130 and automatically rotates to the operating position at an acute angle with the back surface 126 of the second body 120, for the user to operate. Thus, when the user holds the foldable electronic device 100, the user can easily touch the sensing component 140 on the back surface of the body with the user's finger to control the foldable electronic device to perform a corresponding command accordingly (for example, confirmation, volume adjustment, display brightness adjustment, or any specific function).

Figure 4:
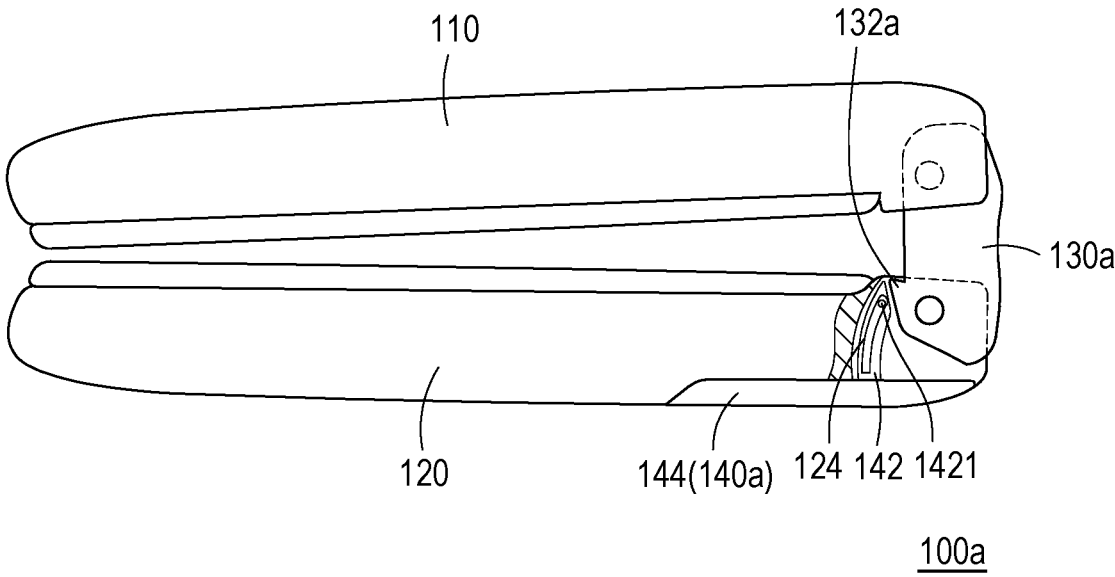
FIG. 4 is a schematic perspective diagram of some components of a foldable electronic device according to an embodiment of the disclosure.
Figure 5:
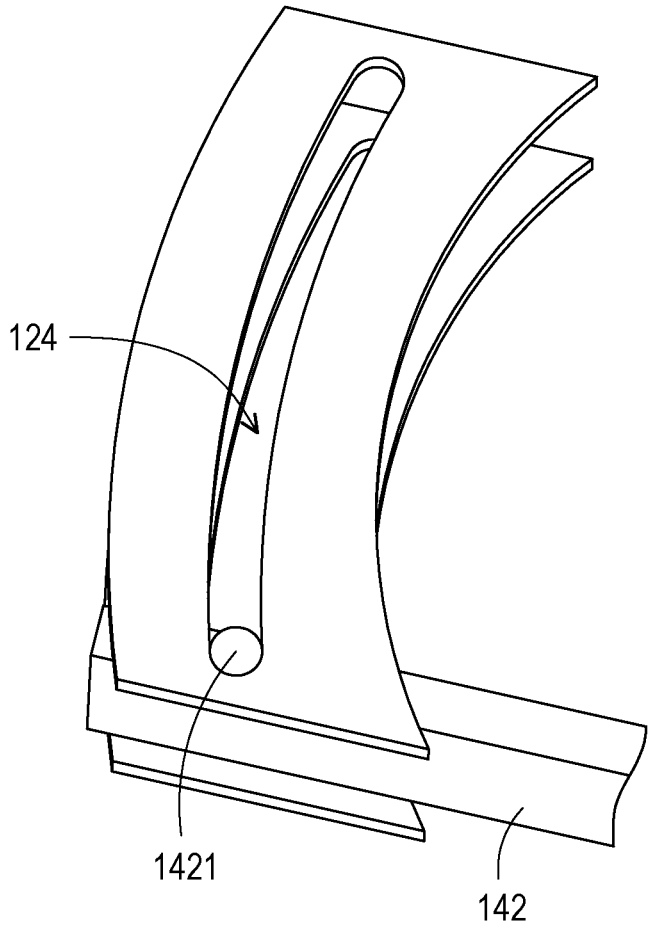
FIG. 5 is a schematic diagram of a slider and a sliding rail of the foldable electronic device of FIG. 4.
Figure 6:
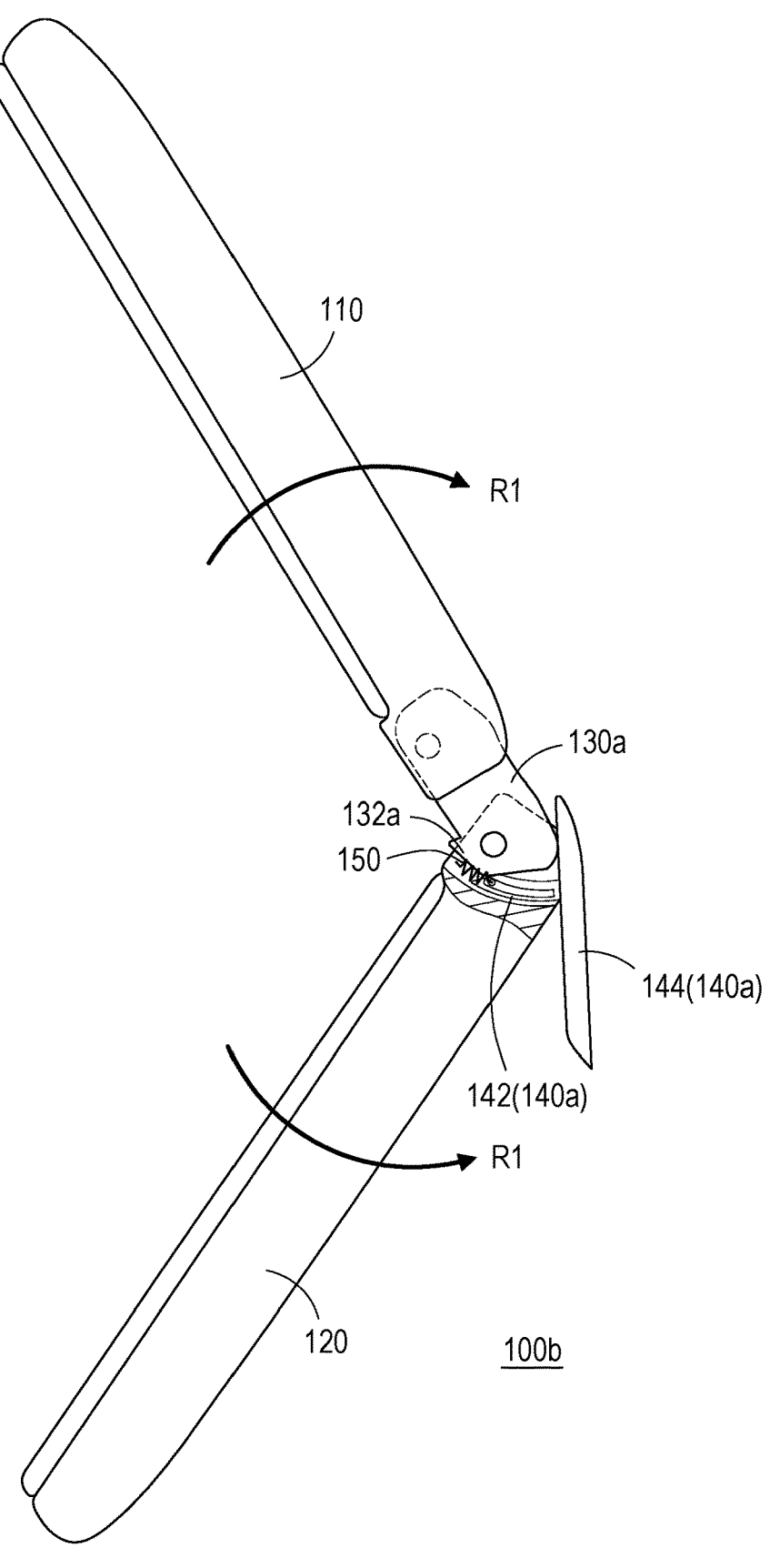
FIG. 6 is a schematic diagram of the foldable electronic device of FIG. 4 in an unfolded state.

FIG. 4 is a schematic perspective diagram of some components of a foldable electronic device according to an embodiment of the disclosure. FIG. 5 is a schematic diagram of a slider and a sliding rail of the foldable electronic device of FIG. 4. FIG. 6 is a schematic diagram of the foldable electronic device of FIG. 4 in an unfolded state. First, referring to FIG. 4 and FIG. 6, for example, in this embodiment, the pivot 130*a* may be a cam structure. Specifically, the driving element of the pivot 130*a* may be a protrusion 132*a* which protrudes from the main contour of the pivot 130*a*. The interfering element 142 of the sensing component 140*a* is rotatably extended and inserted into the second body 120, and is located on the rotation path of the protrusion 132*a*. Thus, when the pivot 130*a* rotates, the protrusion 132*a* may push the interfering element 142 of the sensing component 140*a* to drive the interfering element 142 to rotate, such that the sensing substrate 144 is driven by the interfering element 142 to rotate between the initial position as shown in FIG. 4 and the operating position as shown in FIG. 6 or FIG. 3.

Referring to FIG. 4 and FIG. 5, in an embodiment, the second body 120 further includes a sliding rail 124, and the interfering element 142 further includes a slider 1421 corresponding to the sliding rail 124. The slider 1421 is slidably disposed in the sliding rail 124 to slide along the sliding rail 124. In this embodiment, the sliding rail 124 may be an arc sliding rail. Thus, when the protrusion 132*a* drives the interfering element 142 to rotate, the slider 1421 may slide along the sliding rail 124 of the second body 120, such that the sensing component 140*a* rotates relative to the second body 120 to the operating position at an acute angle with the second body 120.

Referring to FIG. 4 and FIG. 6, in an embodiment, the foldable electronic device 100*a* may further include an elastic restoring element 150, which may be connected between the second body 120 and the interfering element 142 of the sensing component 140*a* and use an elastic restoring force thereof to restore the sensing substrate 144 at the operating position as shown in FIG. 6 to the initial position as shown in FIG. 4. Specifically, when the foldable electronic device 100*a* is in the folded state as shown in FIG. 4, the sensing substrate 144 is at the initial position. At this time, the sensing substrate 144 leans on the back surface of the second body 120, and the elastic restoring element 150 is in a relaxed state without receiving any force. When the foldable electronic device 100*a* rotates to the unfolded state as shown in FIG. 6, the sensing substrate 144 is at the operating position. At this time, the sensing substrate 144 rotates to form an acute angle with the back surface of the second body 120, and the elastic restoring element 150 is stretched to generate the elastic restoring force. Thus, when the foldable electronic device 100*a* is restored from the unfolded state as shown in FIG. 6 to the folded state as shown in FIG. 4, the driving element 132 of the pivot 130*a* returns to the initial position and does not push the interfering element 142, and the elastic restoring element 150 releases the elastic restoring force to restore the sensing substrate 144 at the operating position to the initial position.

Figure 7:
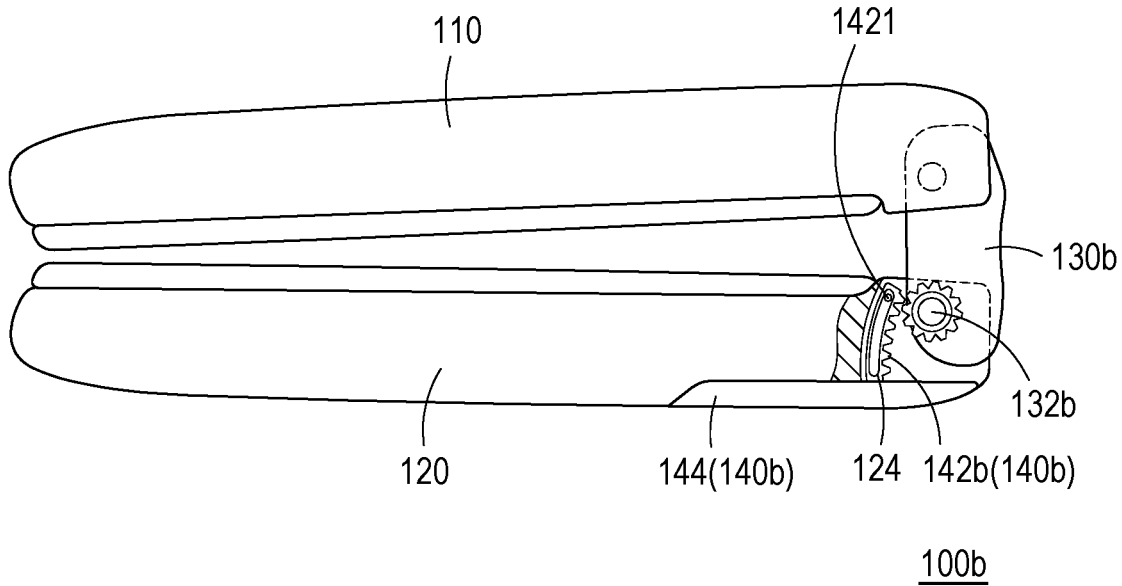
FIG. 7 is a schematic perspective diagram of some components of a foldable electronic device according to another embodiment of the disclosure.
Figure 8:
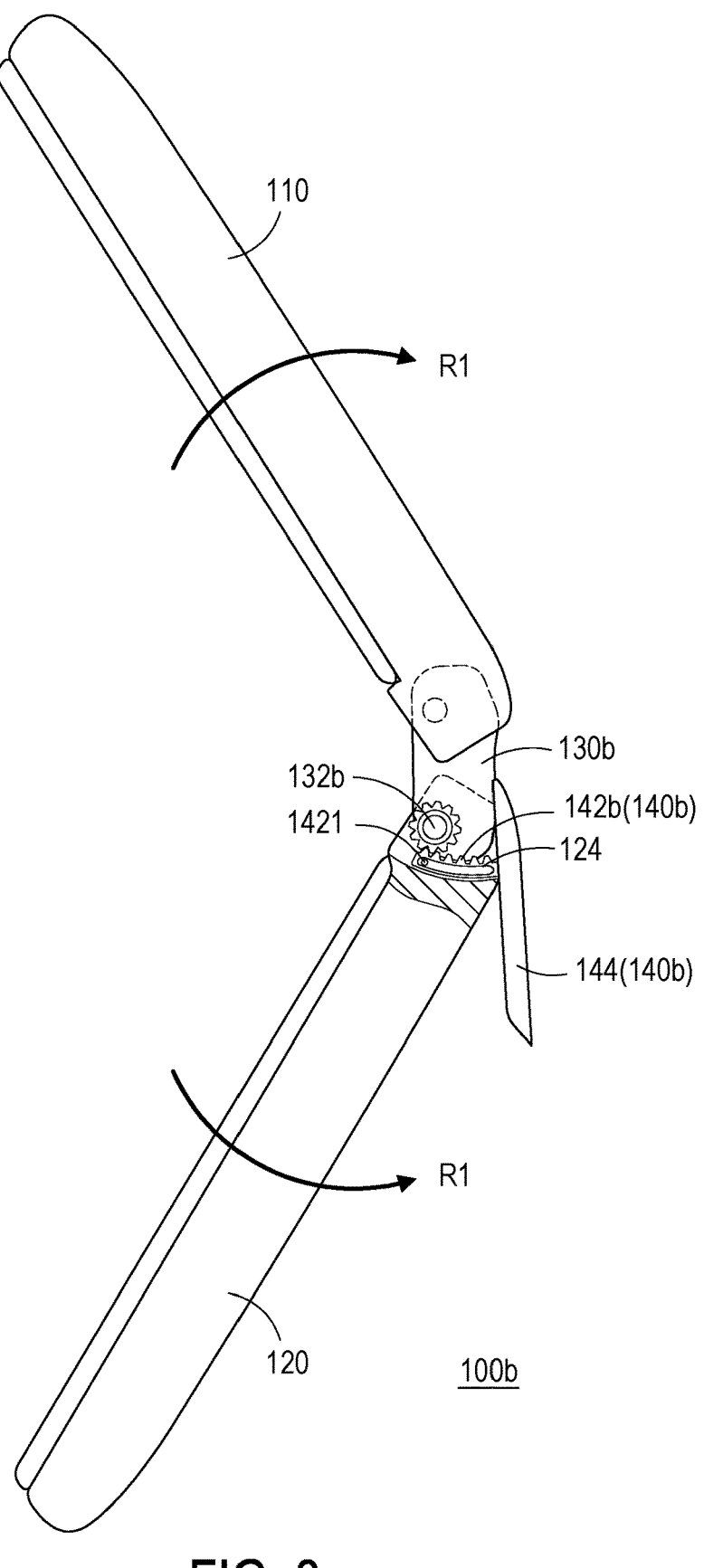
FIG. 8 is a schematic diagram of the foldable electronic device of FIG. 7 in an unfolded state.

FIG. 7 is a schematic perspective diagram of some components of a foldable electronic device according to another embodiment of the disclosure. FIG. 8 is a schematic diagram of the foldable electronic device of FIG. 7 in an unfolded state. It should be noted that the foldable electronic device 100*b* of this embodiment is similar to the foldable electronic devices 100 and 100*a* of the foregoing embodiments. Therefore, this embodiment refers to the reference numerals and some contents of the foregoing embodiments, wherein the same reference numerals are used to denote the same or similar elements, and the description of the same technical contents is omitted. Please refer to the foregoing embodiments for the description of the omitted part, which will not be repeated in this embodiment.

Referring to FIG. 7 and FIG. 8, in this embodiment, the driving element includes a gear 132*b*, and the interfering element may include a rack 142*b*, wherein the rack 142*b* is configured to engage with the gear 132*b*. Thus, when the pivot 130*b* rotates, the gear 132*b* rotates with the pivot 130*b*, so as to drive the rack 142*b* of the sensing component 140*b* to rotate, such that the sensing substrate 144 is driven by the rack 142*b* to rotate between the initial position as shown in FIG. 7 and the operating position as shown in FIG. 8 or FIG. 3.

Referring to FIG. 7 and FIG. 5, in an embodiment, the second body 120 may also include the sliding rail 124 as shown in FIG. 5, and the rack 142*b* may include the slider 1421 corresponding to the sliding rail 124. The slider 1421 is slidably disposed in the sliding rail 124 to slide along the sliding rail 124. In this embodiment, the sliding rail 124 may be an arc sliding rail. Thus, when the gear 132*b* drives the rack 142*b* to rotate, the slider 1421 may slide along the sliding rail 124 of the second body 120, such that the sensing component 140*b* rotates relative to the second body 120 to an operating position at an acute angle with the second body 120.

Figure 9:
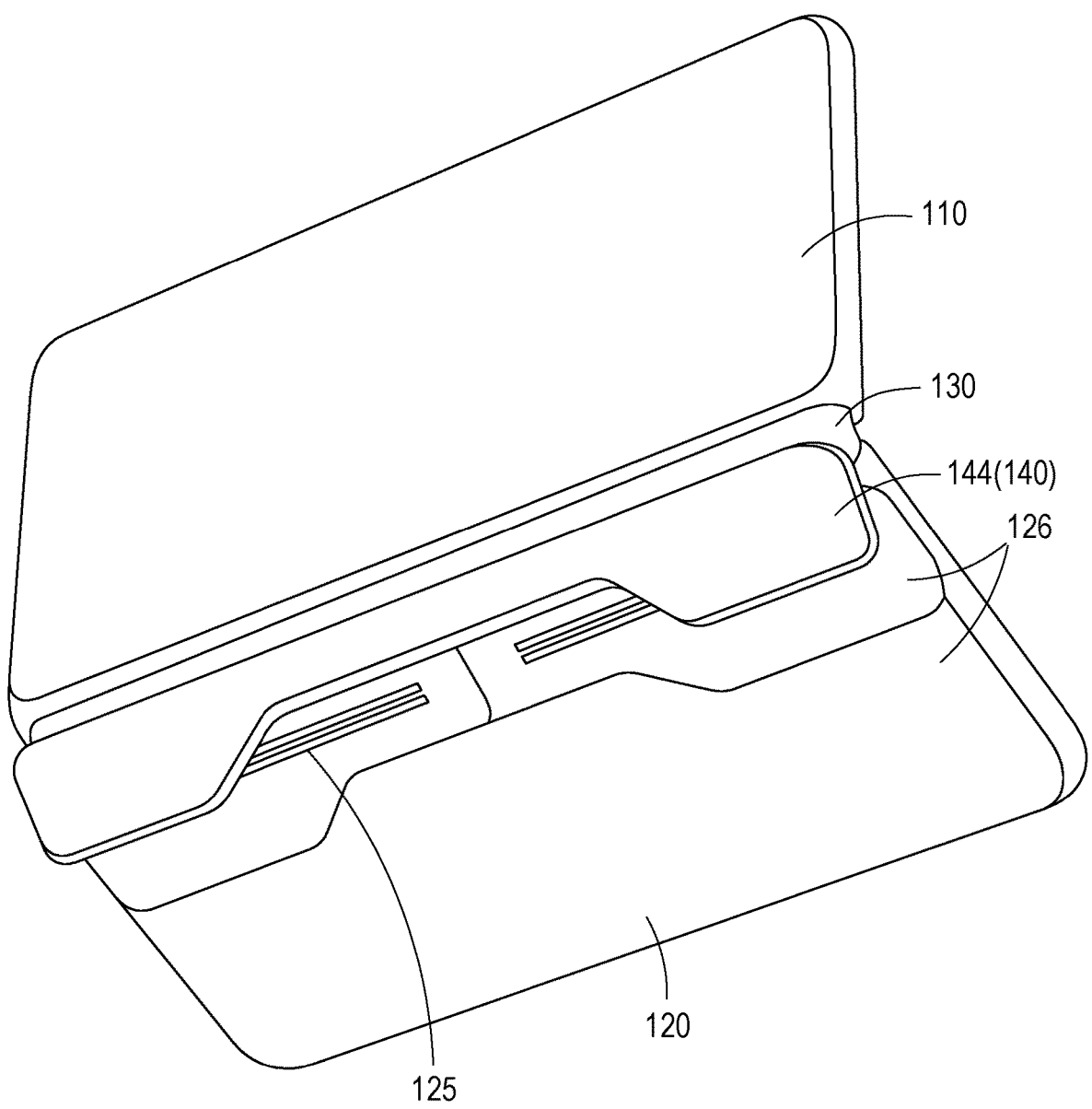
FIG. 9 is a schematic diagram of a foldable electronic device in an unfolded state according to an embodiment of the disclosure.

FIG. 9 is a schematic diagram of a foldable electronic device in an unfolded state according to an embodiment of the disclosure. Referring to FIG. 9, in this embodiment, the second body 120 may further include a plurality of heat dissipation ports 125, which may be respectively disposed on the back surface 126 of the second body 120. In this embodiment, the positions of the heat dissipation ports 125 may correspond to the sensing substrate 144. Specifically, the heat dissipation ports 125 may be disposed under the sensing substrate 144. Thus, when the sensing substrate 144 is at the initial position as shown in FIG. 1, the sensing substrate 144 leans on the back surface to cover the heat dissipation ports 125, and when the sensing substrate 144 is at the operating position as shown in FIG. 9, the sensing substrate 144 may expose the heat dissipation ports 125 to help the foldable electronic device to dissipate heat. In an embodiment, the heat dissipation port 125 may, for example, expose a heat generating element of the foldable electronic device or a heat dissipating element thermally coupled to the heat generating element, such as a heat dissipation fin and a fan. Nevertheless, the disclosure is not limited thereto.

Figure 10:
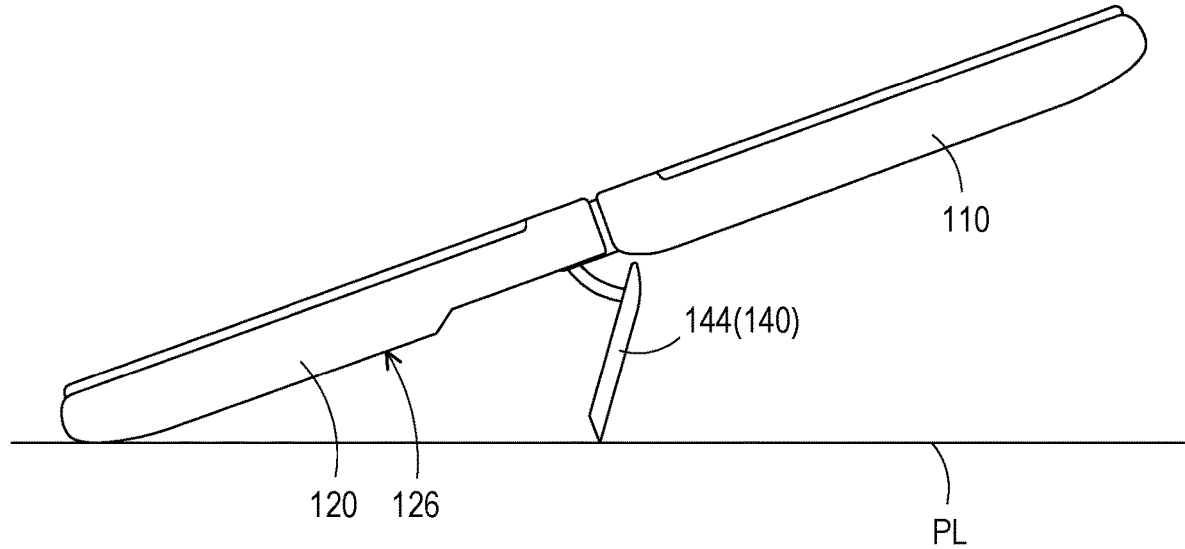
FIG. 10 is a schematic diagram of a situation of using a foldable electronic device in an unfolded state according to an embodiment of the disclosure.

FIG. 10 is a schematic diagram of a situation of using a foldable electronic device in an unfolded state according to an embodiment of the disclosure. In this embodiment, when the foldable electronic device 100 rotates to the unfolded state as shown in FIG. 10, the sensing substrate 144 is driven by the pivot to automatically rotate to the operating position at an acute angle with the back surface 126 of the second body 120. At this time, the sensing substrate 144 may be touched by the user's finger to control the foldable electronic device to perform a corresponding command (for example, confirmation, volume adjustment, display brightness adjustment, or any specific function). What is more, the sensing substrate 144, which forms an acute angle with the back surface 126 of the second body 120, may be supported on a supporting plane PL, such as a desktop, so as to provide support to the foldable electronic device 100.

To sum up, in the foldable electronic device according to the disclosure, the sensing component is disposed at the pivot on the back surface of the body, and the driving element of the pivot and the interfering element of the sensing component form structural interference, so as to drive the interfering element to rotate, such that the sensing substrate of the sensing component rotates along with the pivot between the initial position where the sensing substrate leans on the back surface of the second body and the operating position where the sensing substrate forms an acute angle with the back surface of the second body. With such a configuration, the user may rotate and unfold the foldable electronic device from the folded state to the unfolded state, such that the sensing component is driven by the pivot to automatically rotate to the operating position for the user to operate. Thus, when the user holds the foldable electronic device, the user may easily touch the sensing component located on the back surface of the body with the user's finger to control the foldable electronic device to perform a corresponding command (for example, confirmation, volume adjustment, display brightness adjustment, or any specific function). Therefore, the foldable electronic device according to the disclosure may be expanded with a sensing component with a corresponding function within the limited space, and the position thereof is more convenient for the user to operate, which improves the design flexibility, operation convenience, and user friendliness of the foldable electronic device.

What is claimed is:

1. A foldable electronic device, comprising:
a first body and a second body, wherein the second body comprises a front surface facing the first body and a back surface opposite to the front surface;
a pivot pivotally connected between the first body and the second body, wherein the first body and the second body rotate relative to each other through the pivot, and the pivot comprises a driving element; and
a sensing component coupled to the pivot and the second body and comprising a sensing substrate and an interfering element connecting the sensing substrate, wherein the driving element structurally interferes with the interfering element while rotating along with the pivot, so as to drive the interfering element to rotate, such that the sensing substrate rotates between an initial position where the sensing substrate directly contacts a part of the back surface of the second body and an operating position where an acute angle is formed between the sensing substrate and the back surface of the second body, wherein when the sensing substrate is at the initial position, an outer surface of the sensing substrate is substantially coplanar with another part of the back surface adjacent thereto.

2. The foldable electronic device according to claim 1, wherein the second body further comprises a sliding rail, and the interfering element further comprises a slider slidably disposed in the sliding rail, wherein when the driving element drives the interfering element to rotate, the slider slides along the sliding rail to cause the sensing component to rotate relative to the second body.

3. The foldable electronic device according to claim 1, wherein the interfering element is rotatably inserted into the second body.

4. The foldable electronic device according to claim 1, wherein the driving element comprises a protrusion, and the protrusion is configured to push the interfering element to drive the interfering element to rotate when the pivot rotates.

5. The foldable electronic device according to claim 1, further comprising an elastic restoring element connected between the second body and the interfering element to use an elastic restoring force of the elastic restoring element to restore the sensing substrate at the operating position to the initial position.

6. The foldable electronic device according to claim 1, wherein the driving element comprises a gear, and the interfering element comprises a rack engaged with the gear, wherein the gear drives the rack to rotate when the pivot rotates.

7. The foldable electronic device according to claim 1, wherein the sensing substrate comprises a sensor electrically connected to the second body.

8. The foldable electronic device according to claim 7, wherein the sensor comprises an ultrasonic sensor or a pressure sensor.

9. The foldable electronic device according to claim 1, wherein the second body further comprises a plurality of heat dissipation ports disposed on the back surface of the second body.

10. The foldable electronic device according to claim 9, wherein the sensing substrate covers the plurality of heat dissipation ports when the sensing substrate is at the initial position, and the sensing substrate exposes the plurality of heat dissipation ports when the sensing substrate is at the operating position.

* * * * *